(12) United States Patent
Wang et al.

(10) Patent No.: US 10,205,029 B2
(45) Date of Patent: Feb. 12, 2019

(54) THIN FILM TRANSISTOR, MANUFACTURING METHOD THEREOF, AND DISPLAY DEVICE

(71) Applicant: BOE TECHNOLOGY GROUP CO., LTD., Beijing (CN)

(72) Inventors: Jiushi Wang, Beijing (CN); Dalin Cui, Beijing (CN)

(73) Assignee: BOE TECHNOLOGY GROUP CO., LTD. (CN)

(*) Notice: Subject to any disclaimer, the term of this patent is extended or adjusted under 35 U.S.C. 154(b) by 0 days.

(21) Appl. No.: 15/511,683

(22) PCT Filed: Jan. 19, 2016

(86) PCT No.: PCT/CN2016/071328
§ 371 (c)(1),
(2) Date: Mar. 16, 2017

(87) PCT Pub. No.: WO2017/028493
PCT Pub. Date: Feb. 23, 2017

(65) Prior Publication Data
US 2018/0219105 A1    Aug. 2, 2018

(30) Foreign Application Priority Data
Aug. 14, 2015  (CN) .......................... 2015 1 0502492

(51) Int. Cl.
H01L 29/786    (2006.01)
G02F 1/1333    (2006.01)
(Continued)

(52) U.S. Cl.
CPC .. *H01L 29/78696* (2013.01); *G02F 1/133345* (2013.01); *H01L 27/1214* (2013.01);
(Continued)

(58) Field of Classification Search
CPC ........... H01L 29/1029; H01L 29/78693; H01L 29/78696; H01L 27/1214
See application file for complete search history.

(56) References Cited

U.S. PATENT DOCUMENTS

2008/0258140 A1   10/2008  Lee et al.
2010/0304528 A1   12/2010  Kim et al.
(Continued)

FOREIGN PATENT DOCUMENTS

CN    101908489 A    12/2010
CN    103427023 A    12/2013
(Continued)

OTHER PUBLICATIONS

Second Office Action for Chinese Application No. 201510502492.9, dated Dec. 26, 2017, 4 Pages.
(Continued)

*Primary Examiner* — Joseph Galvin, III
(74) *Attorney, Agent, or Firm* — Brooks Kushman P.C.

(57) ABSTRACT

A TFT, a manufacturing method thereof, and a display device are provided. The TFT includes a semiconductor layer and an etch-stop layer merely covering a channel region of the semiconductor layer. The semiconductor layer and the etch-stop layer are formed through a single patterning process.

15 Claims, 5 Drawing Sheets

(51) Int. Cl.
  *H01L 27/12*  (2006.01)
  *H01L 29/10*  (2006.01)
(52) U.S. Cl.
  CPC ........ *H01L 29/1029* (2013.01); *H01L 29/786* (2013.01); *H01L 29/78693* (2013.01)

(56) References Cited

U.S. PATENT DOCUMENTS

| | | |
|---|---|---|
| 2011/0175088 A1* | 7/2011 | Kim .................. H01L 27/1225 257/57 |
| 2013/0313530 A1 | 11/2013 | Seo et al. |
| 2013/0335691 A1* | 12/2013 | Wu .................... G02F 1/13394 349/155 |
| 2014/0191237 A1 | 7/2014 | Hekmatshoartabari et al. |
| 2015/0340455 A1* | 11/2015 | Cao ...................... G02F 1/1368 257/43 |
| 2016/0284819 A1 | 9/2016 | Wang et al. |
| 2016/0365366 A1 | 12/2016 | Zhao et al. |

FOREIGN PATENT DOCUMENTS

| | | |
|---|---|---|
| CN | 104167365 A | 11/2014 |
| CN | 104681632 A | 6/2015 |
| CN | 105118864 A | 12/2015 |

OTHER PUBLICATIONS

First Office Action for Chinese Application No. 201510502492.9, dated Jul. 21, 2017, 8 Pages.
International Search Report and Written Opinion for Application No. PCT/CN2016/071328, dated May 18, 2016, 9 Pages.

* cited by examiner

THIN FILM TRANSISTOR, MANUFACTURING METHOD THEREOF, AND DISPLAY DEVICE

CROSS-REFERENCE TO RELATED APPLICATION

The present application claims a priority of the Chinese patent application No. 201510502492.9 filed on Aug. 14, 2015, which is incorporated herein by reference in its entirety.

TECHNICAL FIELD

The present disclosure relates to the field of display technology, in particular to a thin film transistor (TFT), a manufacturing method thereof, and a display device.

BACKGROUND

Thin film transistor liquid crystal display (TFT-LCD) has become a mainstream flat display device in the market due to its advantages such as small volume, low power consumption and being free of radiation. As a main structure of the TFT-LCD, a liquid crystal panel includes a plurality of pixel units for displaying an image. Each pixel unit includes a TFT for controlling a display function of the pixel unit. In the related art, depending on a material of a channel, the TFTs may be mainly classified into two types, i.e. an oxide semiconductor TFT (oxide TFT for short) and an amorphous silicon (a-Si) TFT. The oxide TFT has a larger on/off current ratio, i.e., in the case that the oxide TFT is turned on, a larger current may be provided and a charging time may be reduced, and in the case that the oxide TFT is turned off, a smaller leakage current may occur and electric leakage may be prevented. Hence, the oxide TFT is more applicable to the manufacture of a high-end display product with a high resolution (high definition) and a high refresh rate (a more smooth dynamic image).

The oxide TFT with a back channel etching (BCE) structure has been widely used due to its advantages such as simple structure, simple manufacture process, small size and small parasitic capacitance. This kind of oxide TFT includes, from bottom to top, a gate electrode, a gate insulation layer, an oxide semiconductor layer, a source electrode and a drain electrode, and a surface of the oxide TFT is covered with a protection layer. The source electrode and the drain electrode are directly lapped onto the oxide semiconductor layer, and a portion of the oxide semiconductor layer located between the source electrode and the drain electrode is a channel region. In the case that the oxide TFT is turned on, the channel region of the oxide semiconductor layer forms a conductive channel of the oxide TFT.

In the case that the source electrode and the drain electrode are directly lapped onto the oxide semiconductor layer, the channel region of the oxide semiconductor layer may be obviously corroded by an etching process for forming the source and drain electrodes. In the related art, in order to overcome this drawback, an additional etching process for forming on the oxide semiconductor layer an etch-stop layer covering the channel region may be provided. In the case that the source and drain electrodes are formed subsequently, the etch-stop layer may be used to prevent the oxide semiconductor layer under the etch-stop layer from being corroded. However, due to this additional etching process, the entire manufacture process may be more complex and the production cost may increase.

SUMMARY

An object of the present disclosure is to provide a TFT and a manufacturing method thereof, so as to simplify the manufacture process and reduce the production cost in the case that an etch-stop layer is formed on a semiconductor layer.

In one aspect, the present disclosure provides in some embodiments a method for manufacturing a TFT, including a step of forming a semiconductor layer and an etch-stop layer of the TFT through a single patterning process. The etch-stop layer covers a part of the semiconductor layer.

In another aspect, the present disclosure provides in some embodiments a TFT manufactured by the above-mentioned method. The TFT includes a semiconductor layer and an etch-stop layer covering a part of the semiconductor layer.

In yet another aspect, the present disclosure provides in some embodiments a display device including the above-mentioned TFT.

According to the embodiments of the present disclosure, the TFT includes the semiconductor layer and the etch-stop layer, and the etch-stop layer merely covers a channel region of the semiconductor layer. In addition, the semiconductor layer and the etch-stop layer are formed through a single patterning process, without any additional process for forming the etch-stop layer, so it is able to simplify the entire manufacture process for the TFT. In the case that a source electrode and a drain electrode are lapped onto the semiconductor layer, the etch-stop layer may be used to prevent the semiconductor layer thereunder from being etched during the etching process for forming the source electrode and the drain electrode. As a result, it is able to ensure a semiconductor characteristic of the TFT and improve the display quality of the display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
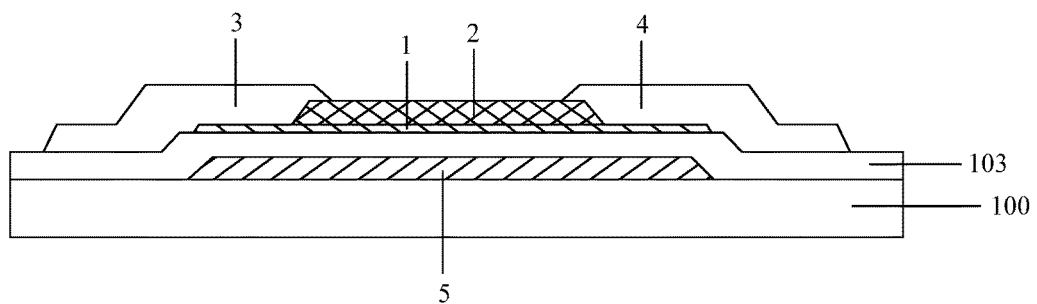
FIG. 1 is a schematic view showing a TFT according to at least one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

For a TFT, a part of its semiconductor layer located between a source electrode and a drain electrode is a channel region. In the case that the TFT is turned on, the channel region may form a conductive channel. In the case that the source electrode and the drain electrode of the TFT are directly lapped onto the semiconductor layer, it is necessary to provide an additional process for forming an etch-stop layer on the semiconductor layer, so as to ensure a semiconductor characteristic of the TFT. However, at this time, the entire manufacture process for the TFT may become more complex and the production cost may increase.

In order to overcome the above-mentioned drawback, the present disclosure provides in some embodiments a TFT and a manufacturing method thereof. The TFT includes a semiconductor layer and an etch-stop layer covering a part of the semiconductor layer. The manufacture method includes a step of forming the semiconductor layer and the etch-stop layer through a single patterning process, without any additional process for forming the etch-stop layer, so it is able to simplify the entire manufacture process for the TFT. In the case that a source electrode and a drain electrode are directly lapped onto the semiconductor layer, the etch-stop layer may be used to prevent the semiconductor layer thereunder from being etched during the etching process for forming the source electrode and the drain electrode. As a result, it is able to ensure a semiconductor characteristic of the TFT and improve the display quality of the TFT display device.

The present disclosure will be described hereinafter in conjunction with the drawings and embodiments. The following embodiments are for illustrative purposes only, but shall not be used to limit the scope of the present disclosure.

The schemes of the present disclosure will be described hereinafter by taking a bottom-gate TFT as an example. FIGS. 2-6 and 1 are the first schematic views showing the manufacture of a TFT according to at least one embodiment of the present disclosure. FIGS. 7-10 and 1 are the second schematic views showing the manufacture of another TFT according to at least one embodiment of the present disclosure. FIGS. 11-13 and 1 are the third schematic views showing the manufacture of yet another TFT according to at least one embodiment of the present disclosure.

As shown in FIG. 1, the present disclosure provides in some embodiments a method for manufacturing a TFT, including a step of forming a semiconductor layer 1 and an etch-stop layer 2 of the TFT through a single patterning process. The etch-stop layer 2 covers a part of the semiconductor layer 1.

The method further includes forming a source electrode 3 and a drain electrode 4 on the etch-stop layer 2. The source electrode 3 and the drain electrode 4 are in contact with the semiconductor layer 1 not covered by the etch-stop layer 2, and the source electrode 3 and the drain electrode 4 are lapped onto the semiconductor layer 1 not covered by the etch-stop layer 2.

According to the embodiments of the present disclosure, the semiconductor layer 1 and the etch-stop layer 2 of the TFT are formed through a single patterning process, without any additional process for forming the etch-stop layer 2 separately. As a result, it is able to simplify the entire manufacture process for the TFT.

The etch-stop layer 2 covers a channel region of the semiconductor layer 1, and two opposite ends of the semiconductor layer 1 are exposed. As shown in FIG. 1, the source electrode 3 and the drain electrode 4 are lapped onto and in electrical contact with the exposed parts of the semiconductor layer 1. Because the part of the semiconductor layer 1 between the source electrode 3 and the drain electrode 4 have been completely covered by the etch-stop layer, it is able to prevent the channel region of the semiconductor layer 1 from being etched, thereby to ensure the semiconductor characteristic of the TFT.

It should be appreciated that, in the case that the source electrode 3 and the drain electrode 4 are lapped onto and in electrical contact with the semiconductor layer 1, a portion of the source electrode 3 and a portion of the drain electrode 4 are in electrical contact with the semiconductor layer 1, without any other layers between the source electrodes 3 and the semiconductor layer 1 and without any other layers between the drain electrodes 4 and the semiconductor layer 1.

Figure 3:
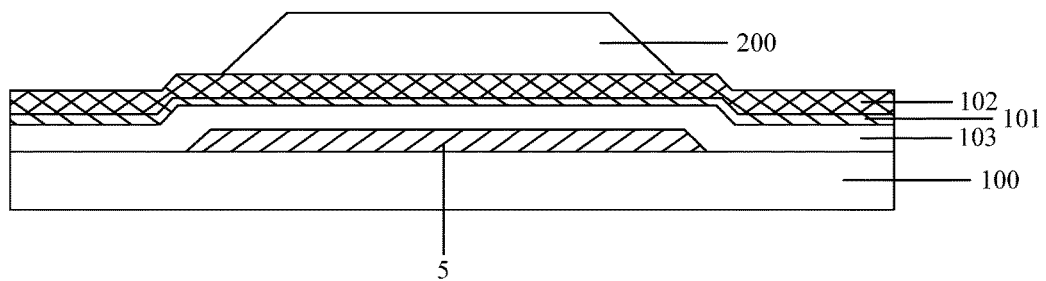
Figure 4:
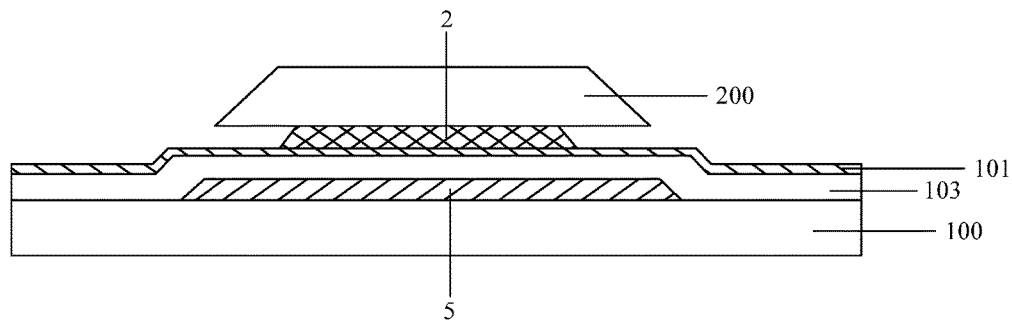
Figure 5:
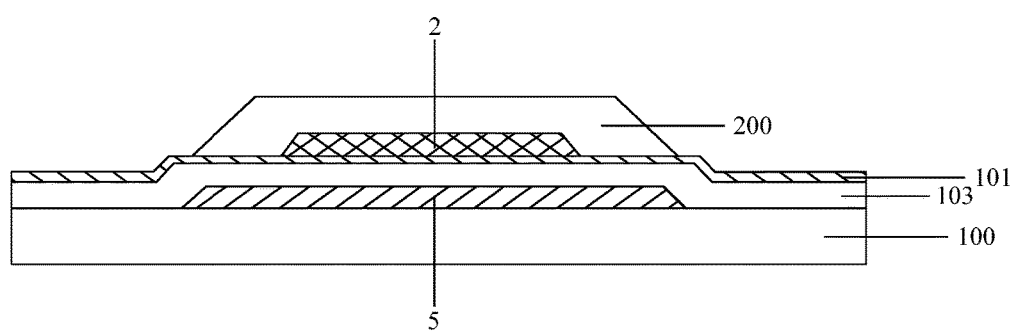
Figure 6:
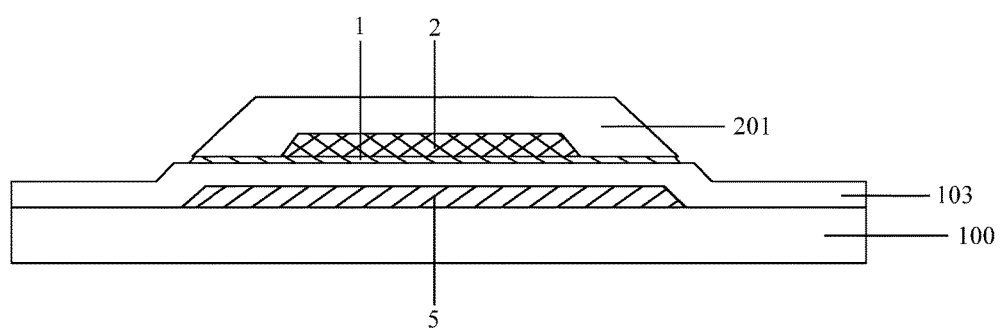

In at least one embodiment, as shown in FIGS. 3-6 and 1, the step of forming the semiconductor layer 1 and the etch-stop layer 2 through a single patterning process includes: forming a semiconductor layer film 101 and an etch-stop layer film 102 sequentially, as shown in FIG. 3; applying a first photoresist 200 onto the etch-stop layer film 102, and exposing and developing the first photoresist 200, so as to provide the first photoresist 200 with a first pattern including a photoresist reserved region and a photoresist unreserved region, as shown in FIG. 3; etching the etch-stop layer film 102 using the first photoresist 200 with the first pattern as a mask plate, so as to remove the etch-stop layer film 102 at the photoresist unreserved region, thereby to form the etch-stop layer 2, as shown in FIG. 4; subjecting the first photoresist 200 with the first pattern to post-exposure baking treatment, so as to enable the first photoresist 200 with the first pattern to cover the etch-stop layer 2, provide the first photoresist 200 with a second pattern, and enable the first photoresist 200 with the second pattern to cover a part of the semiconductor layer film 101, as shown in FIG. 5; and etching the semiconductor layer film 101 using the first photoresist 200 with the second pattern as a mask plate, as shown in FIG. 6, and removing the remaining first photoresist 200, so as to form the semiconductor layer 1 of the TFT, as shown in FIG. 1.

Through the above-mentioned steps, it is able to form the semiconductor layer 1 and the etch-stop layer 2 of the TFT simultaneously through a single patterning process.

As shown in FIG. 5, in the case that the first photoresist 200 with the first pattern covers the etch-stop layer 2, the first photoresist 200 may cover a surface and lateral surfaces of the etch-stop layer 2, i.e., cover the entire etch-stop layer 2.

In the embodiments of the present disclosure, the etch-stop layer 2 may be etched by a dry etching method, and the semiconductor layer 1 may be etched by a wet etching method. For example, the etch-stop layer 2 may be dry-etched using $CF_4/O_2$, and the semiconductor layer 1 may be wet-etched using a mixture of $H_2SO_4$ and $HNO_3$.

In the embodiments of the present disclosure, the semiconductor layer 1 and the etch-stop layer 2 may be etched in different ways, so as to prevent the etch-stop layer 2 from being corroded in the case of etching the semiconductor layer 1 and thereby prevent the pattern of the etch-stop layer 2 from being changed, and meanwhile prevent the semiconductor layer 1 from being corroded in the case of etching the etch-stop layer 2 and thereby prevent the pattern of the semiconductor layer 1 from being changed.

Usually, a wet etching process is adopted to subsequently form the source electrode 3 and the drain electrode 4, so the etch-stop layer 2 may be made of an inorganic material suitable for the dry etching process, e.g., $SiO_2$, SiNx or SiON. In this way, it is able to prevent the etch-stop layer 2 from being obviously corroded due to the etching process for forming the source and drain electrodes. In the case of forming the source electrode 3 and the drain electrode 4 using the wet etching process, usually an acidic liquid including a $H_2O_2$ matrix may be used.

In a possible embodiment of the present disclosure, the etch-stop layer 2 is of a single-layered structure, so as to facilitate the etching operation and the formation of a better profile.

Figure 7:
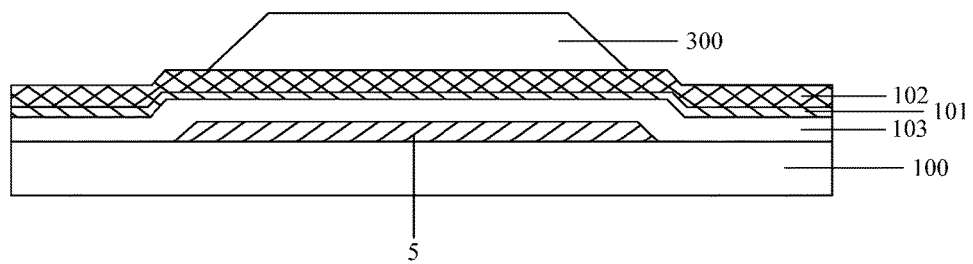
FIGS. 7-10 are second schematic views showing the manufacture of the TFT according to at least one embodiment of the present disclosure.
Figure 8:
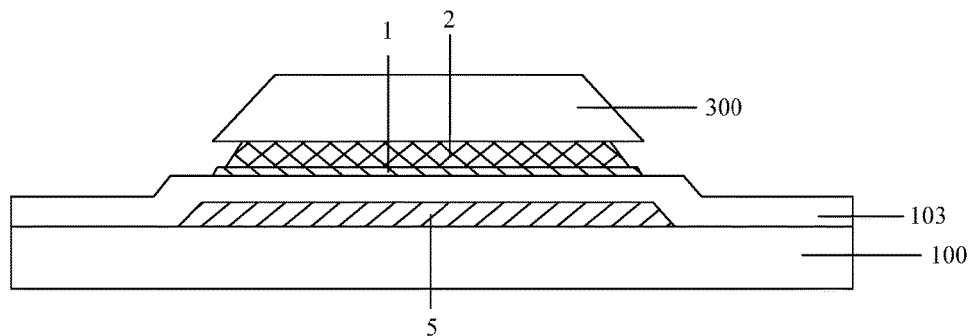
Figure 9:
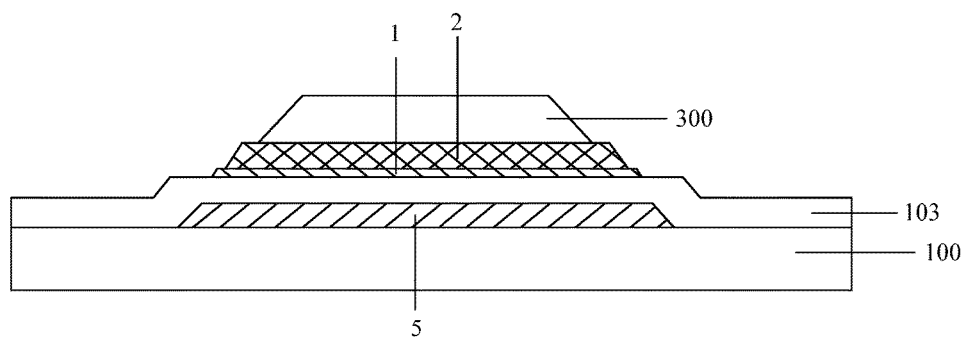
Figure 10:
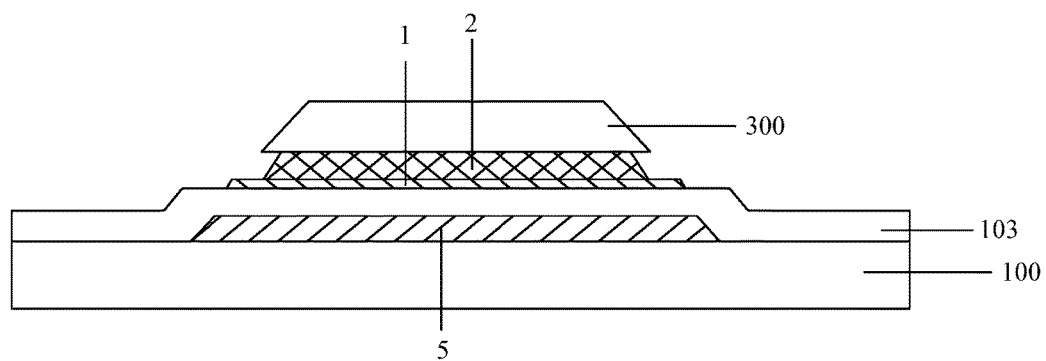

In at least one embodiment of the present disclosure, as shown in FIGS. 7-10 and 1, the step of forming the semiconductor layer 1 and the etch-stop layer through a single patterning process includes: forming the semiconductor layer film 101 and the etch-stop layer film 102 sequentially; applying a second photoresist 300 onto the etch-stop layer 102, and exposing and developing the second photoresist 300, so as to form the second photoresist 300 with a first pattern including a photoresist reserved region and a photoresist unreserved region, as shown in FIG. 7; etching the etch-stop layer film 102 and the semiconductor layer film 101 using the second photoresist 300 with the first pattern as a mask plate, so as to form an intermediate pattern of the etch-stop layer 2 and the semiconductor layer 1, as shown in FIG. 8; ashing the second photoresist 300 with the first pattern, so as to expose a part of the intermediate pattern of the etch-stop layer 2 for a subsequent etching process, provide the second photoresist 300 with a second pattern, and reduce a thickness and an area of the second photoresist 300 to expose the intermediate pattern of the etch-stop layer 2, as shown in FIG. 9, wherein in particular, the second photoresist 300 is ashed with the first pattern through $O_2$; and etching the intermediate pattern of the etch-stop layer 2 using the second photoresist 300 with the second pattern as a mask plate, as shown in FIG. 10, and removing the remaining second photoresist 300 so as to form the etch-stop layer 2, as shown in FIG. 1.

Through the above-mentioned steps, it is able to form the semiconductor layer 1 and the etch-stop layer 2 of the TFT simultaneously through a single patterning process.

In the embodiments of the present disclosure, the etch-stop layer 2 may be etched by a dry etching method, and the semiconductor layer 1 may be etched by a wet etching method. For example, the etch-stop layer 2 may be dry-etched using $CF_4/O_2$, and the semiconductor layer 1 may be wet-etched using a mixture of $H_2SO_4$ and $HNO_3$.

In the embodiments of the present disclosure, the semiconductor layer 1 and the etch-stop layer 2 may be etched in different ways, so as to prevent the etch-stop layer 2 from being corroded in the case of etching the semiconductor layer 1 and thereby prevent the pattern of the etch-stop layer 2 from being changed, and meanwhile prevent the semiconductor layer 1 from being corroded in the case of etching the etch-stop layer 2 and thereby prevent the pattern of the semiconductor layer 1 from being changed.

Usually, a wet etching process is adopted to subsequently form the source electrode 3 and the drain electrode 4, so the etch-stop layer 2 may be made of an inorganic material suitable for the dry etching process, e.g., $SiO_2$, SiNx or SiON. In this way, it is able to prevent the etch-stop layer 2 from being obviously corroded due to the etching process for forming the source and drain electrodes. In the case of forming the source electrode 3 and the drain electrode 4 using the wet etching process, usually a mixture of $H_2SO_4$ and $HNO_3$ may be used.

In a possible embodiment of the present disclosure, the etch-stop layer 2 is of a single-layered structure, so as to facilitate the etching operation and the formation of a better profile.

In the above-mentioned embodiments of the present disclosure, the semiconductor layer 1 and the etch-stop layer 2 may be formed through a single patterning process, and the etch-stop layer may merely cover the channel region of the semiconductor layer 1, so as to prevent the part of the semiconductor layer 1 at the channel region from being corroded due to the subsequent etching process for forming the source electrode 3 and the drain electrode 4, thereby to ensure the semiconductor characteristic of the TFT. In addition, the source electrode 3 and the drain electrode 4 are lapped onto and in contact with the semiconductor layer 1 not covered by the etch-stop layer 2, so as to prevent a bottom layer of the semiconductor layer 1 from being overetched.

The formation of the semiconductor layer and the etch-stop layer of the TFT through a single patterning process is not limited to the above two ways. For example, a grey-tone or half-tone mask plate may also be used.

Figure 11:
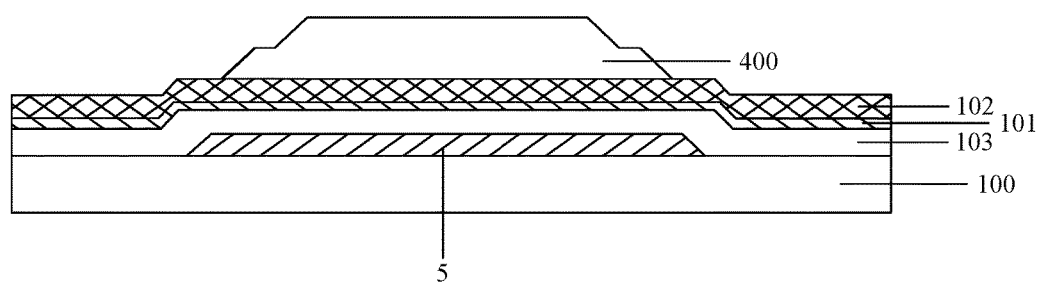
FIGS. 11-13 are third schematic views showing the manufacture of the TFT according to at least one embodiment of the present disclosure.
Figure 12:
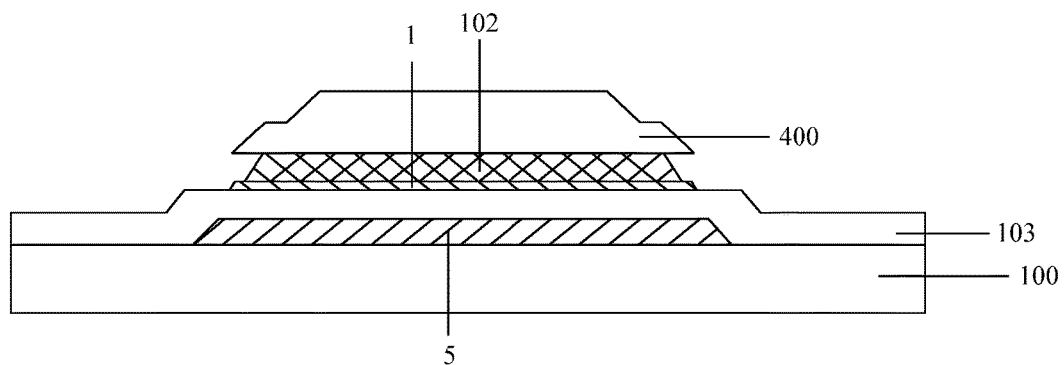
Figure 13:
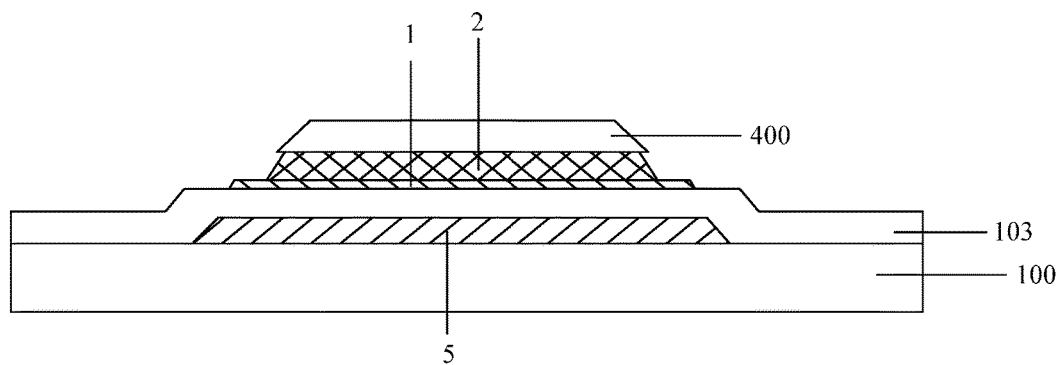

As shown in FIGS. 9-11, in the case that the semiconductor layer 1 and the etch-stop layer 2 of the TFT are to be formed using a grey-tone or half-tone mask plate, the method may include steps of: forming the semiconductor layer film 101 and the etch-stop layer film 102 sequentially, as shown in FIG. 11; applying a third photoresist 400 onto the etch-stop layer film 102, and exposing and developing the third photoresist 400 using the grey-tone or half-tone mask plate, so as to form a photoresist fully-reserved region, a photoresist partially-reserved region and a photoresist unreserved region, as shown in FIG. 11; etching off the semiconductor layer film 101 and the etch-stop layer film 102 at the photoresist unreserved region, as shown in FIG. 12; ashing the remaining third photoresist 400 to remove the third photoresist 400 at the photoresist partially-reserved region and reduce a thickness of the third photoresist 400 at the photoresist fully-reserved region, and etching off the etch-stop layer film 102 at the photoresist partially-reserved region, as shown in FIGS. 12 and 13; and removing the remaining third photoresist 400, so as to form the semiconductor layer 1 and the etch-stop layer 2, as shown in FIG. 1.

Through the above-mentioned steps, it is able to form the semiconductor layer 1 and the etch-stop layer 2 of the TFT simultaneously through a single patterning process.

In the embodiments of the present disclosure, the etch-stop layer 2 may be etched by a dry etching method, and the semiconductor layer 1 may be etched by a wet etching method. For example, the etch-stop layer 2 may be dry-etched using $CF_4/O_2$, and the semiconductor layer 1 may be wet-etched using a mixture of $H_2SO_4$ and $HNO_3$.

In the embodiments of the present disclosure, the semiconductor layer 1 and the etch-stop layer 2 may be etched in different ways, so as to prevent the etch-stop layer 2 from being corroded in the case of etching the semiconductor layer 1 and thereby prevent the pattern of the etch-stop layer 2 from being changed, and meanwhile prevent the semiconductor layer 1 from being corroded in the case of etching the etch-stop layer 2 and thereby prevent the pattern of the semiconductor layer 1 from being changed.

Usually, a wet etching process is adopted to subsequently form the source electrode 3 and the drain electrode 4, so the etch-stop layer 2 may be made of an inorganic material suitable for the dry etching process, e.g., $SiO_2$, SiNx or SiON. In this way, it is able to prevent the etch-stop layer 2 from being obviously corroded due to the etching process for forming the source and drain electrodes. In the case of forming the source electrode 3 and the drain electrode 4 using the wet etching process, usually a mixture of $H_2SO_4$ and $HNO_3$ may be used.

In a possible embodiment of the present disclosure, the etch-stop layer 2 is of a single-layered structure, so as to facilitate the etching operation and the formation of a better profile.

The method may further include a step of forming the source electrode and the drain electrode of the TFT. This step may specifically include: forming a source-drain metal layer film on the etch-stop layer 2; applying a fourth photoresist onto the source-drain metal layer film, and exposing and developing the fourth photoresist, so as to form a photoresist reserved region and a photoresist unreserved region; etching and removing the source-drain metal layer film at the photoresist unreserved region; and removing the remaining fourth photoresist, so as to form the source electrode 3 and the drain electrode 4 which are lapped onto and in electrical contact with the semiconductor layer 1, as shown in FIG. 1.

Usually, the source electrode 3 and the drain electrode 4 are each made of a metal material, e.g., copper. There is a very large contact resistance between a metal and a semiconductor, and in order to improve the ohmic contact between the source and drain electrodes and the semiconductor layer 1, a buffer layer may be arranged between the source and drain electrodes 3, 4 and the semiconductor layer 1. This buffer layer may be formed together with the source and drain electrodes, or separately. In the case that the buffer layer is formed together with the source and drain electrodes, it is able to further the usage times of the mask plate, thereby to simplify the manufacture process. To be specific, the steps may include: forming a first buffer layer film (not shown) on the etch-stop layer 2; forming the source-drain metal layer film (not shown) on the first buffer layer film; and patterning the source-drain metal layer film and the first buffer layer film through a single patterning process, so as to form the source electrode 3, the drain electrode 4 and the first buffer layer.

Through the above-mentioned steps, it is able to form the first buffer layer between the semiconductor layer 1 and the source-drain metal layer, thereby to improve the ohmic contact between the source and drain electrodes 3, 4 and the semiconductor layer 1. The first buffer layer may be made of MoNb.

Properties of the TFT may be easily affected by an environment, so after the formation of the TFT, the TFT may be covered by an inorganic insulation layer.

In a possible embodiment of the present disclosure, in order to improve the adhesivity between the source and drain electrodes and the inorganic insulation layer and prevent the source and drain electrodes from being oxidized, the method may further include steps: forming a second buffer layer film (not shown) on the etch-stop layer 2; forming the source-drain metal layer film (not shown) on the second buffer layer film; forming a third buffer layer film (not shown) on the source-drain metal layer film; and patterning the third buffer layer film, the source-drain metal layer film and the second buffer layer film through a single patterning process, so as to form the source electrode 3 and the drain electrode 4.

Through the above-mentioned steps, it is able to form the second buffer layer between the semiconductor layer 1 and the source-drain metal layer, thereby to improve the ohmic contact between the source and drain electrodes 3, 4 and the semiconductor layer 1. The source-drain metal layer is arranged between the second buffer layer and the third buffer layer. Through the third buffer layer, it is able to improve the adhesivity between the source and drain electrodes 3, 4 and the inorganic insulation layer 1 and prevent surfaces of the source and drain electrodes from being oxidized. The second buffer layer and the third buffer layer may each be made of MoNb.

In at least one embodiment of the present disclosure, as shown in FIGS. 1-6, the method for manufacturing the bottom-gate TFT may specifically include the following steps.

Figure 2:
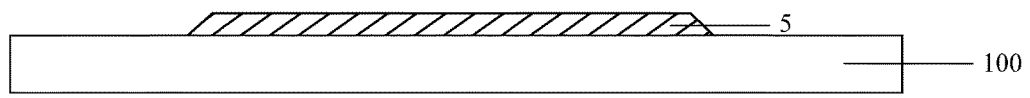
FIGS. 2-6 are first schematic views showing the manufacture of the TFT according to at least one embodiment of the present disclosure.

Step S1: forming a gate metal layer onto a substrate 100 (a transparent substrate, e.g., a glass or quartz substrate), and patterning the gate metal layer, so as to form a gate electrode 5, as shown in FIG. 2. To be specific, the gate metal layer may be formed by magnetron sputtering, thermal evaporation or any other film-forming process. The gate metal layer may be made of Cu, Al, Ag, Mo, Cr, Nd, Ni, Mn, Ti, Ta or W, or an alloy thereof. The gate metal layer may be of a single-layered structure, or a multi-layered structure such as Cu/Mo, Ti/Cu/Ti or Mo/Al/Mo.

Step S2: forming a gate insulation layer 103 on the substrate 100 obtained after Step S1. The gate insulation layer 103 may be made of an oxide, a nitride or an oxynitride, and it may be of a single-layered, double-layered or multi-layered structure. To be specific, the gate insulation layer 103 may be made of SiNx, SiOx or Si(ON)x.

Step S3: forming the semiconductor layer film 101 and the etch-stop layer film 102 sequentially on the substrate 100 obtained after Step S2, as shown in FIG. 3, and patterning the semiconductor layer film 101 and the etch-stop layer film 102 through a single patterning process so as to form the semiconductor layer 1 and the etch-stop layer 2 of the TFT. The etch-stop layer 2 may cover a part of the semiconductor layer 1. Preferably, the semiconductor layer may be made of a metal oxide semiconductor material, e.g., one or more selected from the group consisting of amorphous HIZO, ZnO, $TiO_2$, CdSnO, MgZnO, IGO, IZO, ITO and IGZO. The semiconductor layer 1 may be formed on the substrate 100 through such a film-forming process as pulsed laser deposition or magnetron sputtering. The patterning process for forming the semiconductor layer 1 and the etch-stop layer 2 has been described hereinbefore, and thus will not be particularly defined herein.

Step S4: forming the source electrode 3 and the drain electrode 4 on the substrate 100 obtained after Step S3. The manufacture process for them has been described hereinbefore, and thus will not be particularly defined herein.

Step S5: forming a passivation layer (not shown) on the substrate obtained after Step S4. The passivation layer may be made of an oxide, a nitride or an oxynitride, and it may be of a single-layered, double-layered or multi-layered structure. To be specific, the passivation layer may be made of SiNx, SiOx or Si(ON)x.

As shown in FIG. 1, the present disclosure further provides in some embodiments a TFT manufactured using the above-mentioned method. The TFT includes the semiconductor layer 1 and the etch-stop layer 2 covering a part of the semiconductor layer 1.

The TFT further includes the source electrode 3 and the drain electrode 4 which are lapped onto and in electrical contact with the semiconductor layer 1. In the case of forming the source electrode 3 and the drain electrode 4, the etch-stop layer 2 may be used to prevent the semiconductor layer 1 thereunder from being corroded, so as to ensure the properties of the TFT.

Usually, the source electrode 3 and the drain electrode 4 may each be made of a metal material, e.g., copper, aluminum or molybdenum. The semiconductor layer 1 may be made of a metal oxide (e.g., an oxide of indium, gallium or zinc, e.g., IGZO, ZnON, ITZO, ZTO, ZIO, IGO or AZTO), or a silicon semiconductor.

In order to improve the ohmic contact between the source and drain electrodes 3, 4 and the semiconductor layer 1, a first buffer layer (not shown) may be arranged between the source and drain electrodes 3, 4 and the semiconductor layer 1.

A buffer layer (not shown) may be further arranged on the source electrode 3 and the drain electrode 4, so as to improve the adhesivity between the source and drain electrodes 3, 4 and the inorganic insulation layer. The buffer layer may be made of MoNb.

In a possible embodiment of the present disclosure, a second buffer layer may be arranged between the source and drain electrodes 3, 4 and the semiconductor layer 1, and a third buffer layer may be arranged on the source electrode 3 and the drain electrode 4.

Taking a bottom-gate TFT as an example, as shown in FIG. 1, the TFT may include: the substrate 100; the gate electrode 5 arranged on the substrate 100; the gate insulation layer 103 covering the gate electrode 5; the semiconductor layer 1 and the etch-stop layer 2 arranged on the gate insulation layer 103 in such manner that the etch-stop layer 2 merely covers the channel region of the semiconductor layer 1, with the other portions of the semiconductor layer 1 being exposed; the source electrode 3 and the drain electrode 4 lapped onto and being in contact with the semiconductor layer 1 not covered by the etch-stop layer 2, a portion of the semiconductor layer 1 located between the source electrode 3 and the drain electrode 4 being the channel region; the second buffer layer arranged between the source and drain electrodes 3, 4 and the semiconductor layer 1; and the third buffer layer arranged on the source electrode 3 and the drain electrode 4.

In at least one embodiment, the present disclosure further provides a TFT display device, which includes the above-mentioned TFT. The TFT includes the semiconductor layer and the etch-stop layer merely covering the channel region of the semiconductor layer. In the etching process for forming the source and drain electrodes, through the etch-stop layer, it is able to prevent the semiconductor layer under the etch-stop layer from being corroded, thereby to ensure the properties of the TFT and improve the display quality of the display device.

The display device may be a liquid crystal display device, or an organic light-emitting diode (OLED) display device, or another display device. To be specific, the display device may any product or member having a display function, such as a display substrate, a liquid crystal panel, an electronic paper, an OLED panel, a mobile phone, a flat-panel computer, a television, a display, a laptop computer, a digital photo frame or a navigator.

The above are merely the preferred embodiments of the present disclosure. Obviously, a person skilled in the art may make further modifications and improvements without departing from the spirit of the present disclosure, and these modifications and improvements shall also fall within the scope of the present disclosure.

The invention claimed is:

1. A method for manufacturing a thin film transistor (TFT), comprising:
forming a semiconductor layer and an etch-stop layer of the TFT by using a single mask plate, wherein the etch-stop layer covers a part of the semiconductor layer,
wherein forming the semiconductor layer and the etch-stop layer of the TFT by using the single mask plate comprises:
forming a semiconductor layer film and an etch-stop layer film sequentially;
applying a first photoresist onto the etch-stop layer film, and exposing and developing the first photoresist, to provide the first photoresist with a first pattern comprising a photoresist reserved region and a photoresist unreserved region, wherein the first photoresist with the first pattern directly contacts the etch-stop layer film and does not directly contact the semiconductor layer film;
etching the etch-stop layer film using the first photoresist with the first pattern as the mask plate, to remove the etch-stop layer film at the photoresist unreserved region, thereby to form the etch-stop layer;
subjecting the first photoresist with the first pattern to post-exposure baking treatment, to enable the first photoresist with the first pattern to cover the etch-stop layer, provide the first photoresist with a second pattern, and enable the first photoresist with the second pattern to cover a part of the semiconductor layer film, wherein the first photoresist with the second pattern directly contacts both the etch-stop layer and the semiconductor layer film; and
etching the semiconductor layer film using the first photoresist with the second pattern as the mask plate, and removing the remaining first photoresist, to form the semiconductor layer of the TFT.

2. The method according to claim 1, wherein the etch-stop layer film is etched using a dry etching method, and the semiconductor layer film is etched using a wet etching method.

3. The method according to claim 2, wherein $CF_4/O_2$ is used for the dry etching method, and a mixture of $H_2SO_4$ and $HNO_3$ is used for the wet etching method.

4. The method according to claim 3, further comprising: forming a source electrode and a drain electrode of the TFT, wherein forming the source electrode and the drain electrode of the TFT comprises:
forming a source-drain metal layer film on the etch-stop layer;

applying a fourth photoresist onto the source-drain metal layer film, and exposing and developing the fourth photoresist, to form a photoresist reserved region and a photoresist unreserved region;

etching off the source-drain metal layer film at the photoresist unreserved region of the fourth photoresist; and removing the remaining fourth photoresist, to form the source electrode and the drain electrode which are lapped onto and in electrical contact with the semiconductor layer.

5. The method according to claim 4, wherein in the case that the source electrode and the drain electrode are lapped onto and in electrical contact with the semiconductor layer, a portion of the source electrode and a portion of the drain electrode are in contact with the semiconductor layer, no other layer is arranged between the source electrodes and the semiconductor layer, and no other layer is arranged between the drain electrodes and the semiconductor layer.

6. The method according to claim 2, further comprising: forming a source electrode and a drain electrode of the TFT, wherein forming the source electrode and the drain electrode of the TFT comprises:

forming a source-drain metal layer film on the etch-stop layer;

applying a fourth photoresist onto the source-drain metal layer film, and exposing and developing the fourth photoresist, to form a photoresist reserved region and a photoresist unreserved region;

etching off the source-drain metal layer film at the photoresist unreserved region of the fourth photoresist; and removing the remaining fourth photoresist, to form the source electrode and the drain electrode which are lapped onto and in electrical contact with the semiconductor layer.

7. The method according to claim 6, wherein in the case that the source electrode and the drain electrode are lapped onto and in electrical contact with the semiconductor layer, a portion of the source electrode and a portion of the drain electrode are in contact with the semiconductor layer, no other layer is arranged between the source electrodes and the semiconductor layer, and no other layer is arranged between the drain electrodes and the semiconductor layer.

8. The method according to claim 1, further comprising: forming a source electrode and a drain electrode of the TFT, wherein forming the source electrode and the drain electrode of the TFT comprises:

forming a source-drain metal layer film on the etch-stop layer;

applying a fourth photoresist onto the source-drain metal layer film, and exposing and developing the fourth photoresist, to form a photoresist reserved region and a photoresist unreserved region;

etching off the source-drain metal layer film at the photoresist unreserved region of the fourth photoresist; and removing the remaining fourth photoresist, to form the source electrode and the drain electrode which are lapped onto and in electrical contact with the semiconductor layer.

9. The method according to claim 8, wherein in the case that the source electrode and the drain electrode are lapped onto and in electrical contact with the semiconductor layer, a portion of the source electrode and a portion of the drain electrode are in contact with the semiconductor layer, no other layer is arranged between the source electrodes and the semiconductor layer, and no other layer is arranged between the drain electrodes and the semiconductor layer.

10. A thin film transistor (TFT) manufactured by the method according to claim 1, comprising the semiconductor layer and the etch-stop layer covering the part of the semiconductor layer.

11. The TFT according to claim 10, further comprising a source electrode and a drain electrode which are lapped onto and in electrical contact with the semiconductor layer.

12. The TFT according to claim 11, wherein in the case that the source electrode and the drain electrode are lapped onto and in electrical contact with the semiconductor layer, a portion of the source electrode and a portion of the drain electrode are in contact with the semiconductor layer, no other layer is arranged between the source electrodes and the semiconductor layer, and no other layer is arranged between the drain electrodes and the semiconductor layer.

13. The TFT according to claim 11, wherein the source electrode and the drain electrode are each made of copper.

14. The TFT according to claim 10, wherein the semiconductor layer is made of a metal oxide.

15. A display device comprising the TFT according to claim 10.

* * * * *